United States Patent
Vali et al.

(10) Patent No.: US 12,027,219 B2
(45) Date of Patent: Jul. 2, 2024

(54) TRACKING RC TIME CONSTANT BY WORDLINE IN MEMORY DEVICES

(71) Applicant: Micron Technology, Inc., Boise, ID (US)

(72) Inventors: Tommaso Vali, Sezze (IT); Agostino Macerola, San Benedetto dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 17/868,708

(22) Filed: Jul. 19, 2022

(65) Prior Publication Data

US 2023/0037884 A1    Feb. 9, 2023

Related U.S. Application Data

(60) Provisional application No. 63/203,912, filed on Aug. 4, 2021.

(51) Int. Cl.
*G11C 16/10*     (2006.01)
*G11C 16/34*     (2006.01)

(52) U.S. Cl.
CPC ........ *G11C 16/3459* (2013.01); *G11C 16/102* (2013.01); *G11C 16/3404* (2013.01)

(58) Field of Classification Search
CPC .............. G11C 16/3459; G11C 16/102; G11C 16/3404; G11C 16/08; G11C 16/10; G11C 16/0483; G11C 16/32
See application file for complete search history.

(56) References Cited

U.S. PATENT DOCUMENTS

2016/0099059 A1*   4/2016   Chen ...................... G11C 16/10
                                                          365/185.17
2020/0143893 A1*   5/2020   Rabkin .............. G11C 16/3445

* cited by examiner

*Primary Examiner* — Xiaochun L Chen
(74) *Attorney, Agent, or Firm* — Lowenstein Sandler LLP

(57) ABSTRACT

A memory device includes a memory array comprising a plurality of wordlines, and control logic, operatively coupled with the memory array. The control logic causes a measurement programming pulse to be sequentially applied to each of the plurality of wordlines of the memory array and determines respective threshold voltages stored in a number of memory cells associated with each of the plurality of wordlines. The control logic further determines a difference in the respective threshold voltages based on a location of the number of memory cells within each wordline and determines a respective resistance-capacitance (RC) time constant for each of the plurality of wordlines in view of the difference in the respective threshold voltages.

20 Claims, 7 Drawing Sheets

TRACKING RC TIME CONSTANT BY WORDLINE IN MEMORY DEVICES

RELATED APPLICATION

This application claims the benefit of U.S. Provisional Application Ser. No. 63/203,912, file Aug. 4, 2021, which is herein incorporated by reference in its entirety.

TECHNICAL FIELD

Embodiments of the disclosure relate generally to memory sub-systems, and more specifically, relate to tracking the RC time constant by wordline in memory devices of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
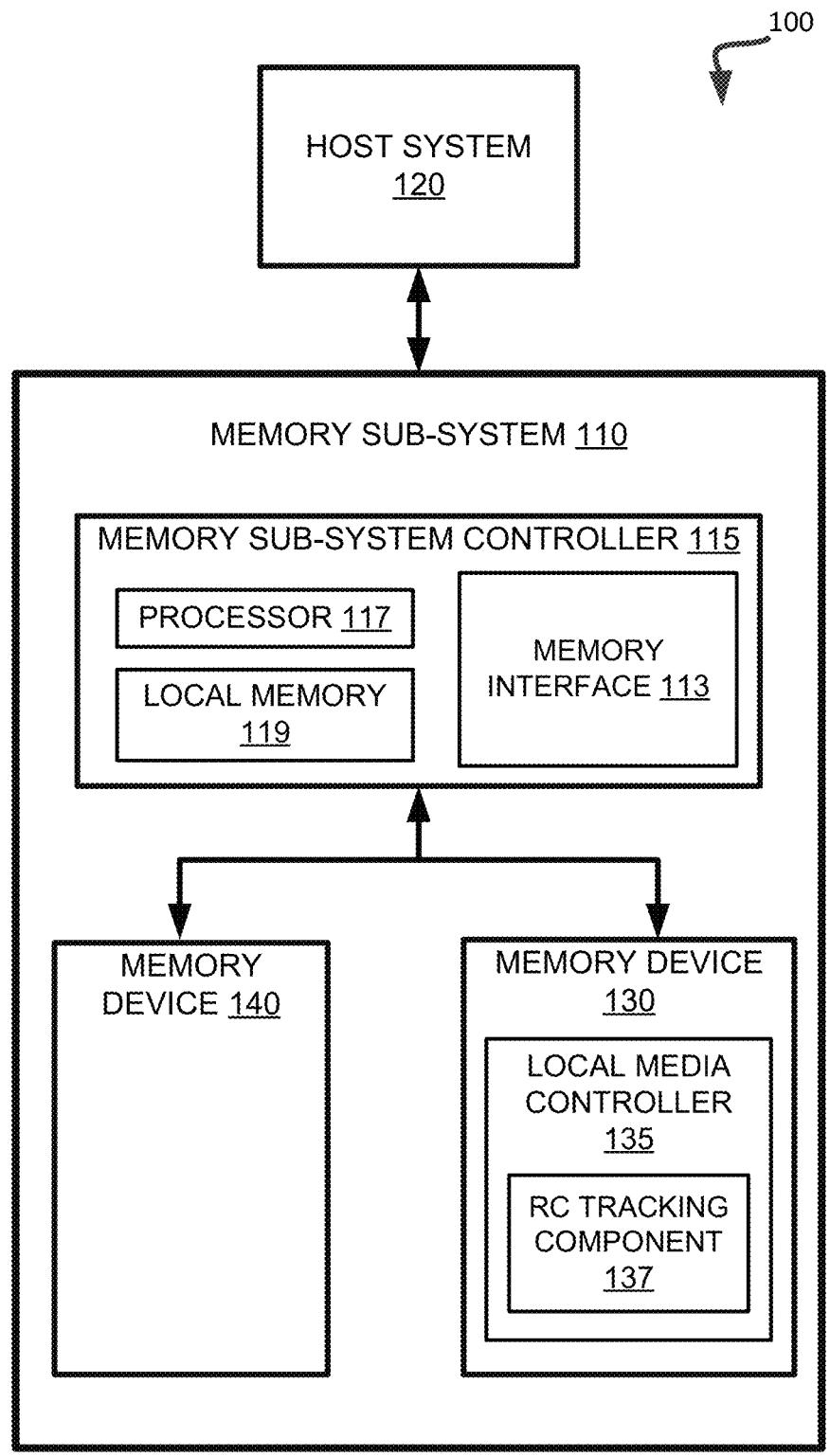
FIG. 1A illustrates an example computing system that includes a memory sub-system in accordance with some embodiments of the present disclosure.

Aspects of the present disclosure are directed to tracking the RC time constant by wordline in memory devices of a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

The performance of a memory device, such as a NAND memory device, is largely dependent on the resistance of the NAND circuitry. There are inherent resistances in the conducting materials chosen for the circuits, and there are resistances due to the configuration of the circuits. Even though a low resistance metal may be chosen for a conductor, the size of the cross section of a conductor affects its resistivity, and neighboring structures can create a capacitance that causes additional resistance in the conductor. The combination of these effects in a circuit can be measured by a constant referred to as a resistance-capacitance (RC) time constant. A lower resistance in the circuit leads to a lower value of the RC time constant, and a faster performing memory device. The RC time constant is especially affected by wordline design due to the extended length of wordlines, as well as their small size, as they are integrated into access transistors. In addition, since the wordlines intersect vertical pillars of a memory array to form the memory cells, the RC time constant of a given wordline can be impacted by the geometry of those intersections. In certain memory devices, the pillars can have a tapered shape, including one or more steps where the width of the pillars changes significantly. Thus, since the surface area of the intersection with the pillars varies with each wordline, the RC constant of each wordline can also vary. For example, wordlines that intersect a pillar where the pillar is thicker can have a higher resistivity and a higher RC time constant.

Knowledge of the RC time constant of a given wordline in a memory array has numerous benefits. For example, the RC time constant of a wordline can be used to monitor degradation of the wordline due to program/erase cycling, to detect defects in the wordline (e.g., an electrical short to an adjacent wordline), to optimize overdrive and underdrive performance for the wordline, to optimize programming time while maintaining an adequate read window between threshold distributions for the wordline, and other potential benefits. Measuring the RC time constant of a given wordline presents challenges, however. On certain memory dies, for example, only one block may include a probing pad allowing for connection of external measurement circuitry. Thus, measurements of the RC time constant are only possible for a small portion of the total wordlines in the memory arrays on those dies. Since the RC time constant can vary significantly between wordlines in the memory array as described above, the RC time constant for the majority of wordlines is unknown, and the advantages associated with knowing the RC time constant of those wordlines cannot be realized.

Aspects of the present disclosure address the above and other issues by allowing for tracking the RC time constant by wordline in memory devices of a memory sub-system. In one embodiment, control logic of the memory device performs a measurement process internally within the memory device by which the RC time constant of each individual wordline of a memory array of the memory device can be determined. In one embodiment, the control logic sequentially causes a measurement programming pulse to be applied each wordline of the memory array and subsequently causes the threshold voltage programmed to a plurality of memory cells at different points along each wordline to be read. Due to resistance along the length of each wordline, the threshold voltage can decrease as the memory cells get further away from a near end of the wordline at which the measurement programming pulse was applied. By measuring the threshold voltage of at least a subset of the cells along each wordline, the control logic can determine a respective slope of the cell threshold voltage (i.e., an amount of change in the threshold voltage across the corresponding memory cells) for each wordline. In one embodiment, the control logic can utilize a lookup table, or other data structure, including a number of entries each relating a certain slope of cell threshold voltage to a corresponding RC time constant, to determine respective RC time constants for each wordline. In one embodiment, upon determining the respective RC time constants, the control logic can cause an indication of the RC time constant to be programmed to one or more memory cells of each respective wordline, so that the RC time constant is easily available for future use.

Advantages of this approach include, but are not limited to, improved performance of the memory device. The RC time constant tracking techniques described herein allow for easy determination of respective RC time constants for each individual wordline of a memory array of the memory device. Once known and stored, the control logic can use the RC time constant of each wordline to improve performance of the memory device, such as by monitoring degradation of the wordline due to program/erase cycling based on changes to the RC time constant over time, detecting defects in the wordline (e.g., an electrical short to an adjacent wordline) based on a sudden change in the RC time constant, optimizing overdrive and underdrive performance for the wordline based on the RC time constant, optimizing programming time based on the RC time constant while maintaining an adequate read window between threshold distributions for the wordline, or other performance improvements.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes local media controller 135, which itself includes RC time constant tracking component 137. As described herein, the RC time constant tracking component 137 performs a measurement process internally within the memory device 130 by which the RC time constant of each individual wordline of a memory array of the memory device 130 can be determined. Further details with regards to the operations of local media controller 135 and the RC time constant tracking component 137 are described below.

Figure 1B:
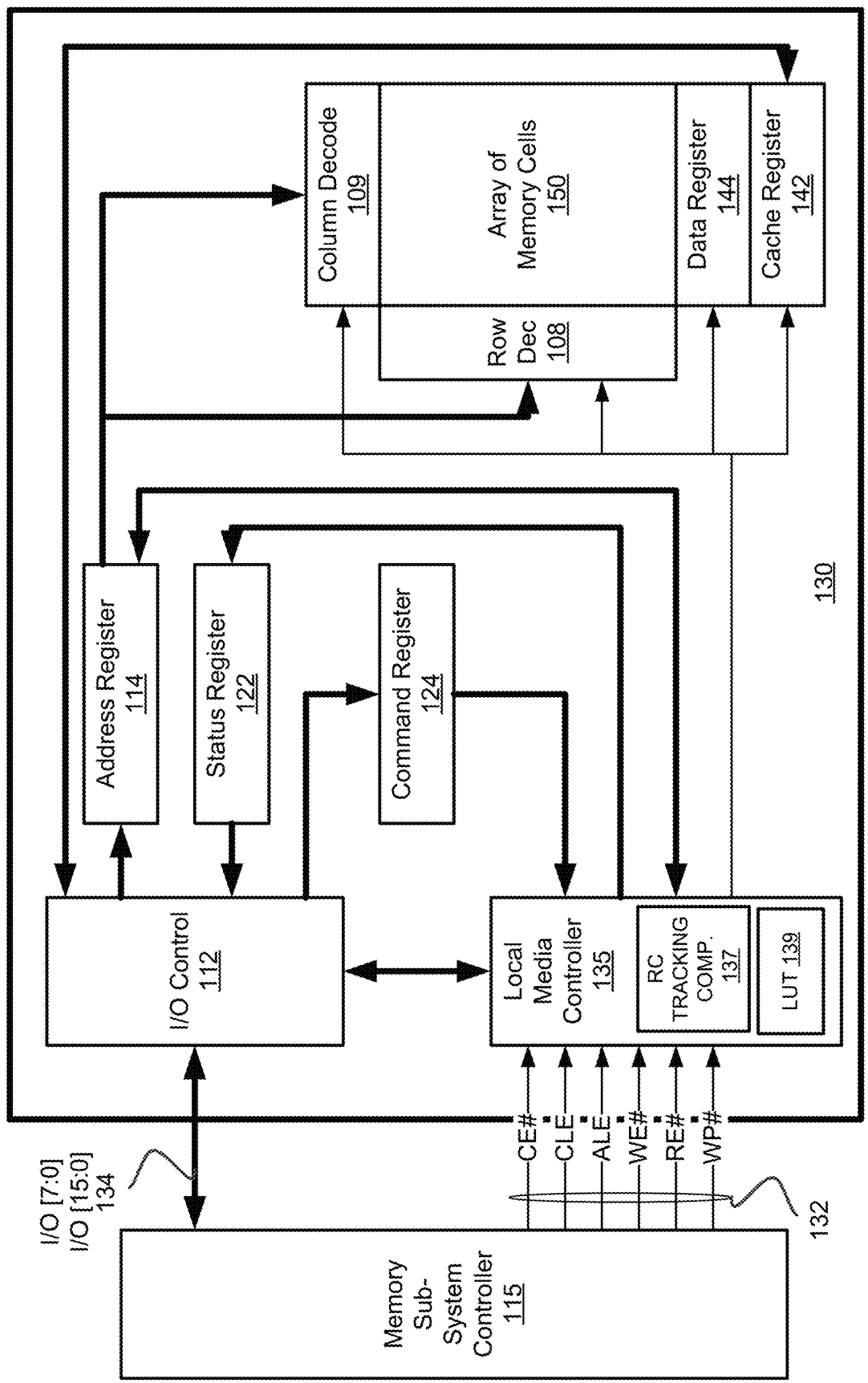
FIG. 1B is a block diagram of a memory device in communication with a memory sub-system controller of a memory sub-system, according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 150 are capable of being programmed to one of at least two target data states.

Row decode circuitry 108 and column decode circuitry 109 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 109 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 109 to control the row decode circuitry 108 and column decode circuitry 109 in response to the addresses.

The local media controller 135 is also in communication with a cache register 142. Cache register 142 latches data, either incoming or outgoing, as directed by the local media controller 135 to temporarily store data while the array of memory cells 150 is busy writing or reading, respectively, other data. During a program operation (e.g., write operation), data may be passed from the cache register 142 to the data register 144 for transfer to the array of memory cells 150; then new data may be latched in the cache register 142 from the I/O control circuitry 112. During a read operation, data may be passed from the cache register 142 to the I/O control circuitry 112 for output to the memory sub-system controller 115; then new data may be passed from the data register 144 to the cache register 142. The cache register 142 and/or the data register 144 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115. As described herein, memory device 130 can include multiple status registers, including separate status registers associated with each respective partition (e.g., plane) of memory device 130, as well as a die-level status register for memory device 130.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

In one embodiment, local media controller 135 includes the RC time constant tracking component 137 which sequentially causes a measurement programming pulse to be applied each wordline of the memory array 150 and subsequently causes the threshold voltage programmed to a plurality of memory cells at different points along each wordline to be read. Due to resistance along the length of each wordline, the threshold voltage can decrease as the memory cells get further away from a near end of the wordline at which the measurement programming pulse was applied (e.g., by one or more signal drivers not shown in FIG. 1B). By measuring the threshold voltage of at least a subset of the cells along each wordline, the RC time constant tracking component 137 can determine a respective slope of the cell threshold voltage (i.e., an amount of change in the threshold voltage across the corresponding memory cells) for each wordline. In one embodiment, the RC time constant tracking component 137 utilizes a lookup table 139, or other data structure to determine respective RC time constants for each of the wordlines. Depending on the embodiment, lookup table 139 can be part of local media controller 135, can be part of memory array 150, or can be located elsewhere on memory device 130. Lookup table 139 can include a number of entries each relating a certain slope of cell threshold voltage to a corresponding RC time constant. For example, the RC time constant tracking component 137 can identify an entry in lookup table 139 including an indication of the determined slope and determine the corresponding RC time constant from that entry. The entries in lookup table 139 can be populated before operation of memory device 130, where the values in the entries are determined via a testing process performed during device manufacture. In one embodiment, upon determining the respective RC time constants, the RC time constant tracking component 137 can cause an indication of the RC time constant to be programmed to one or more memory cells of each respective wordline, so that the RC time constant is easily available for future use.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 142. The data may be subsequently written into data register 144 for programming the array of memory cells 150.

In an embodiment, cache register 142 may be omitted, and the data may be written directly into data register 144. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
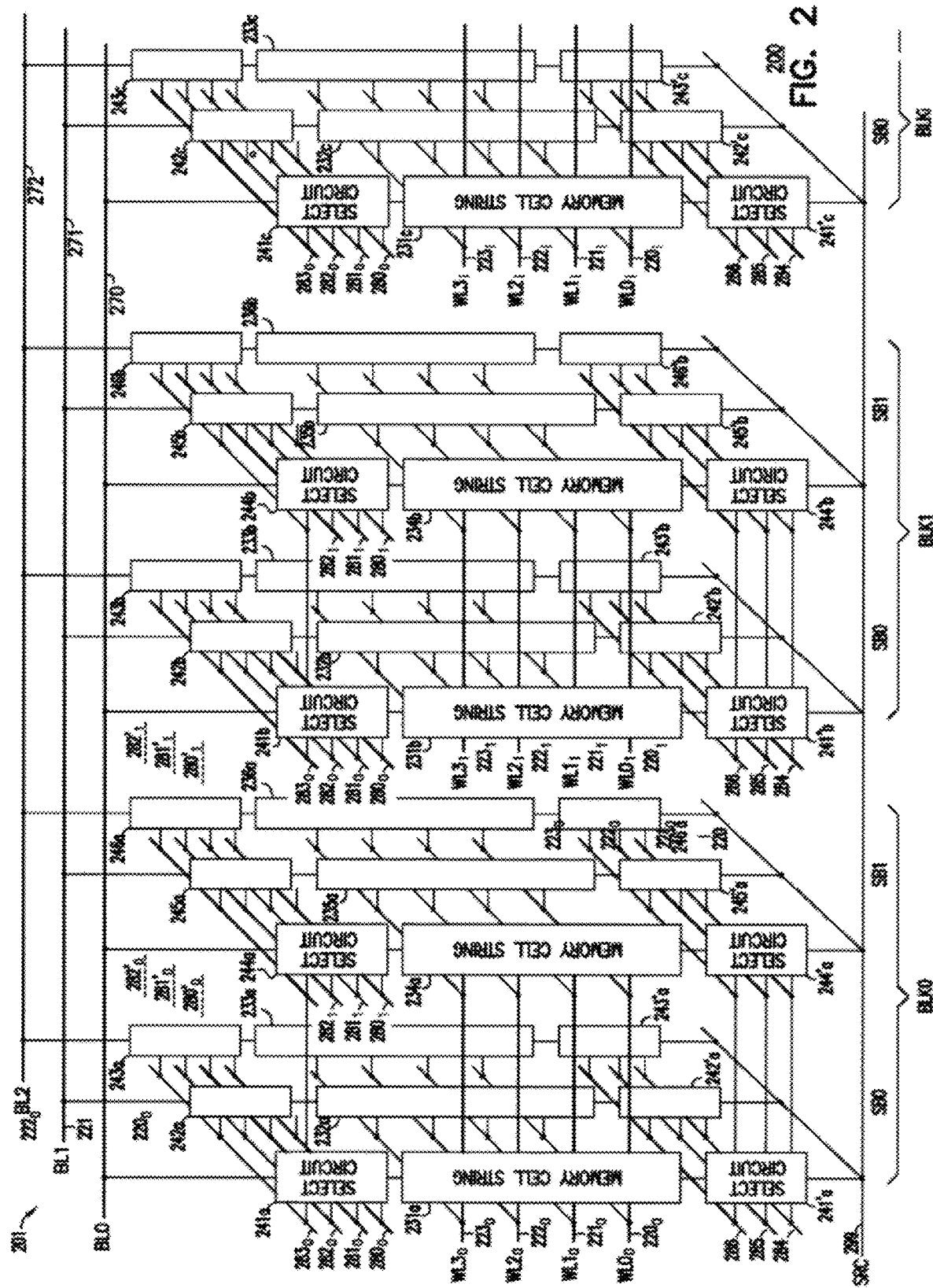
FIG. 2 is a schematic block diagram of a portion of a memory device including a memory array having memory cell strings and associated select circuits and select lines according to some embodiments.

FIG. 2 is a schematic block diagram of a portion of a memory device 200 including a memory array 201 having memory cell strings and associated select circuits and select lines according to some embodiments. Memory device 200 can correspond to memory device 130 of FIGS. 1A-1B. For example, memory array 201 can form part of the array of memory cells 104 of FIG. 1B.

As shown in FIG. 2, memory device 200 can include blocks (blocks of memory cells) BLK0, BLK1, through BLKi. Three blocks are shown as an example. Memory device 200 can include many blocks (e.g., up to thousands or more blocks). In the physical structure of memory device 200, the blocks can be arranged (e.g., formed) one block next to another block, such that each block can have a neighboring block. Neighboring blocks are blocks located immediately (e.g., adjacent) next to each other. For in example, in the physical structure of memory device 200, blocks BLK0 and BLK1 can be neighboring blocks.

Each of blocks BLK0, BLK1 through BLKi of memory device 200 can include (e.g., can be divided into) sub-blocks. For example, each of blocks BLK0 and BLK1 can include sub-blocks SB0 and SB1. Block BLKi can include a sub-block SB0 (and a sub-block SB1, which is not shown). Blocks BLK0, BLK1, through BLKi can include the same number of sub-blocks. FIG. 2 shows an example where each of blocks BLK0, BLK1 through BLKi can include two sub-blocks (e.g., SB0 and SB1). However, each of blocks BLK0, BLK1 through BLKi can have more than two blocks (e.g., SB0, SB1, SB2, SB3, and so on).

As shown in FIG. 2, each sub-block (e.g., SB0 or SB1) has its own memory cell strings, and each of the memory cell strings can be associated with (e.g., coupled to) select circuits. For example, sub-block SB0 of block BLK0 has memory cell strings 231$a$, 232$a$, and 233$a$ and associated select circuits (e.g., drain select circuits) 241$a$, 242$a$, and 243$a$, and select circuits (e.g., source select circuits) 241'$a$, 242'$a$, and 243'$a$. Sub-block SB1 of block BLK0 has memory cell strings 234$a$, 235$a$, and 236$a$ and associated select circuits (e.g., drain select circuits) 244$a$, 245$a$, and 246$a$, and select circuits (e.g., source select circuits) 244'$a$, 245'$a$, and 246'$a$.

Sub-block SB0 of block BLK1 has memory cell strings 231$b$, 232$b$, and 233$b$, and associated select circuits (e.g., drain select circuits) 241$b$, 242$b$, and 243$b$, and select circuits (e.g., source select circuits) 241'$b$, 242'$b$, and 243'$b$. Sub-block SB1 of block BLK1 has memory cell strings 234$b$, 235$b$, and 236$b$, and associated select circuits (e.g., drain select circuits) 244$b$, 245$b$, and 246$b$, and select circuits (e.g., source select circuits) 244'$b$, 245'$b$, and 246'$b$.

Sub-block SB0 of BLKi has memory cell strings 231$c$, 232$c$, and 233$c$, and associated select circuits (e.g., drain select circuits) 241$c$, 242$c$, and 243$c$, and select circuits (e.g., source select circuits) 241'$c$, 242'$c$, and 243'$c$. The sub-blocks of the blocks (e.g., blocks BLK0, BLK1 through BLKi) of memory device 200 can have the same number of memory cell strings and associated select circuits.

FIG. 2 shows an example of three memory cell strings and their associated circuits in a sub-block (e.g., in sub-block SB0). The number of memory cell strings and their associated select circuits in each the sub-block of blocks BLK0, BLK1, through BLKi can vary. Memory device 200 can include data lines 270, 271, and 272 that carry signals BL0, BL1, and BL2, respectively. Each of data lines 270, 271, and 272 can be structured as a conductive line (which includes conductive materials). The memory cell strings of blocks BLK0, BLK1, through BLKi can share data lines 270, 271, and 272.

For example, memory cell strings 231$a$, 234$a$ (of block BK0), 231$b$, 234$b$ (of block BLK1), and 231$c$ (of BLKi) can share data line 270. Memory cell strings 232$a$, 235$a$ (of block BK0), 232$b$, 235$b$ (of block BK1), and 232$c$ (of block BLKi) can share data line 271. Memory cell strings 233$a$, 236$a$ (of block BK0), 233$b$, 236$b$ (of block BK1), and 233$c$ (of block BKi) can share data line 272. FIG. 2 shows three data lines 270, 271, and 272 as an example. The number of data lines can vary.

Memory device 200 can include a line 299 that can carry a signal SRC (e.g., source line signal). Line 299 can be structured as a conductive line (which includes conductive materials) and can form part of a source (e.g., a source line) of memory device 200. Blocks BLK0, BLK1, through BLKi can share line 299. Alternatively, each of blocks BLK0, BLK1, through BLKi can have its own line (e.g., source) similar to line 299.

Memory device 200 can include access lines in blocks BLK0, BLK1 through BLKi in which the access lines are electrically separated from each other within the same block and electrically separated from block to block. As shown in FIG. 2, each of blocks BLK0, BLK1, BLK2, and BLK3 can include its own access lines associated with signals (e.g., wordline signals) WL0, WL1, WL2, and WL3. For example, in block BLK0, memory device 200 includes access lines (which can be or can include wordlines) $220_0$, $221_0$, $222_0$, and $223_0$ (e.g., a group of access lines) that can carry corresponding signals (e.g., wordline signals) $WL0_0$, $WL1_0$, $WL2_0$, and $WL3_0$, respectively.

In block BLK1, memory device 200 includes access lines (which can be or can include wordlines) $220_1$, $221_1$, $222_1$, and $223_1$ (e.g., a group of access lines) that can carry corresponding signals (e.g., wordline signals) $WL0_1$, $WL1_1$, $WL2_1$, and $WL3_1$, respectively. In block BLKi, memory device 200 includes access lines (which can be or can include wordlines) $220_i$, $221_i$, $222_i$, and $223_i$ that can carry corresponding signals (e.g., wordline signals) $WL0_i$, $WL1_i$, $WL2_i$, and $WL3_i$.

Access lines $220_0$ through $223_0$, $220_1$ through $223_1$, and $220_1$ through $223_1$ can be structured as conductive access lines (which include conductive materials) that can form part of respective access lines of memory device 200 to access memory cells in a respective block. FIG. 2 shows four access lines ($220_0$ through $223_0$, $220_1$ through $223_1$, or $220_1$ through $223_1$) in each of blocks BLK0, BLK1, through BLKi as an example. The number of access lines can vary.

In sub-block SB0 of block BK0, memory device 200 includes select lines (e.g., drain select lines) $280_0$, $281_0$, $282_0$, and $283_0$ that can be shared by select circuits 241a, 242a, and 243a. In sub-block SB1 of block BK0, memory device 200 includes select lines (e.g., drain select lines) $280_1$, $281_1$, $282_1$, and $283_1$ that can be shared by select circuits 244a, 245a, and 246a. Block BLK0 can include select lines (e.g., source select lines) 284, 285, and 286 that can be shared by select circuits 241'a, 242'a, 243'a, 244'a, 245'a, and 246'a.

In sub-block SB0 of block BLK1, memory device 200 includes select lines (e.g., drain select lines) $280_0$, $281_0$, $282_0$, and $283_0$ that can be shared by select circuits 241b, 242b, and 243b. In sub-block SB1 of block BLK1, memory device 200 includes select lines (e.g., drain select lines) $280_1$, $281_1$, $282_1$, and $283_1$ that can be shared by select circuits 244b, 245b, and 246b. Block BLk1 can include select lines (e.g., source select lines) 284, 285, and 286 that can be shared by select circuits 241'b, 242'b, 243'b, 244'b, 245'b, and 246'b. In sub-block SB0 of block BLKi, memory device 200 includes select lines (e.g., drain select lines) $280_0$, $281_0$, $282_0$, and $283_0$ that can be shared by select circuits 241c, 242c, and 243c; and select lines (e.g., source select lines) 284, 285, and 286 that can be shared by select circuits 241'c, 242'c, and 243'c.

FIG. 2 shows an example where memory device 200 includes four drain select lines (e.g., $280_0$, $281_0$, $282_0$, and $283_0$) associated with a drain select circuit (e.g., 241a, 242a, or 243a) in a sub-block (e.g., sub-block SB0 of block BLK0). However, memory device 200 can include fewer or more than four drain select lines associated with a drain select circuit. Similarly, FIG. 2 shows an example where memory device 200 includes three source select lines (e.g., 284, 285, and 286) associated with a source select circuit (e.g., 241'a, 242'a, or 243'a) in a sub-block (e.g., sub-block SB0 of block BLK0). However, memory device 200 can include fewer or more than three source select lines associated with a source select circuit.

Memory device 200 can include connections $280'_0$, $281_0$, $282'_0$, $283'_0$, $280'_1$, $281_1$, $282'_1$, $283'_1$, where each of which can electrically connect two respective select lines. FIG. 2 shows connections $280'_0$, $281_0$, $282'_0$, $283'_0$, $280'_1$, $281_1$, $282'_1$, $283'_1$ by themselves to avoid crowding the elements shown in FIG. 2. FIG. 2 shows a connection $280'_0$ to indicate select line $280_0$ of sub-block SB0 of block BLK0 (sometimes referred to as select line $280_0$/SB0/BLK0) and select line $280_0$ of sub-block SB0 of block BLK1 (sometimes referred to as select line $280_0$/SB0/BLK1) can be in electrical contact (e.g., can be electrically connected) to each other through connection $280'_0$. Thus, in memory device 200, select lines $280_0$/SB0/BLK0 and $280_0$/SB0/BLK1 can be provided (e.g., applied) with the same signal. This also means that select lines $280_0$/SB0/BLK0 and $280_0$/SB0/BLK1 can receive the same signal during an operation (e.g., read, write, or erase operation) of memory device 200.

FIG. 2 shows a connection $281'_0$ to indicate select line $281_0$ of sub-block SB0 of block BLK0 (sometimes referred to as select line $281_0$/SB0/BLK0) and select line $281_0$ of sub-block SB0 of block BLK1 (sometimes referred to as select line $281_0$/SB0/BLK1) can be in electrical contact (e.g., can be electrically connected) to each other through connection $281'_0$. Thus, in memory device 200, select lines $281_0$/SB0/BLK0 and $281_0$/SB0/BLK1 can be provided (applied) with the same signal. This also means that select lines $281_0$/SB0/BLK0 and $281_0$/SB0/BLK1 can receive the same signal during an operation (e.g., read, write, or erase operation) of memory device 200.

FIG. 2 shows a connection $282'_0$ to indicate select line $282_0$ of sub-block SB0 of block BLK0 (sometimes referred to as select line $282_0$/SB0/BLK0) and select line $282_0$ of sub-block SB0 of block BLK1 (sometimes referred to as select line $282_0$/SB0/BLK1) can be in electrical contact (e.g., can be electrically connected) to each other through connection $282'_0$. Thus, in memory device 200, select lines $282_0$/SB0/BLK0 and $282_0$/SB0/BLK1 can be provided (applied) with the same signal. This also means that select lines $282_0$/SB0/BLK0 and $282_0$/SB0/BLK1 can receive the same signal during an operation (e.g., read, write, or erase operation) of memory device 200.

FIG. 2 shows a connection $283'_0$ to indicate select line $283_0$ of sub-block SB0 of block BLK0 (sometimes referred to as select line $283_0$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_0$. Thus, in memory device 200, select lines $283_0$/SB0/BLK0 and $283_1$/SB0/BLK0 can be provided (applied) with the same signal. This also means that select lines $283_0$/SB0/BLK0 and $283_1$/SB0/BLK1 can receive the same signal during an operation (e.g., read, write, or erase operation) of memory device 200.

FIG. 2 shows a connection $280'_1$ to indicate select line $280_1$ of sub-block SB1 of block BLK0 (sometimes referred to as select line $280_1$/SB1/BLK0) and select line $280_1$ of sub-block SB1 of block BLK1 (sometimes referred to as select line $280_1$/SB1/BLK1) can be in electrical contact (e.g., can be electrically connected) to each other through connection $281'_1$. Thus, in memory device 200, select lines $280_1$/SB1/BLK0 and $280_1$/SB1/BLK1 can be provided (applied) with the same signal. This also means that select lines $280_1$/SB1/BLK0 and $280_1$/SB1/BLK1 can receive the same signal during an operation (e.g., read, write, or erase operation) of memory device 200.

FIG. 2 shows a connection $281'_1$ to indicate select line $281_1$ of sub-block SB1 of block BLK0 (sometimes referred to as select line $281_1$/SB1/BLK0) and select line $281_1$ of sub-block SB1 of block BLK1 (sometimes referred to as select line $281_1$/SB1/BLK1) can be in electrical contact (e.g., can be electrically connected) to each other. Thus, in memory device 200, select lines $281_1$/SB1/BLK0 and $281_1$/SB1/BLK1 can be provided (applied) with the same signal. This also means that select lines $281_1$/SB1/BLK0 and $281_1$/SB1/BLK1 can receive the same signal during an operation (e.g., read, write, or erase operation) of memory device 200.

FIG. 2 shows a connection $282'_1$ to indicate select line $282_1$ of sub-block SB1 of block BLK0 (sometimes referred to as select line $282_1$/SB1/BLK0) and select line $282_1$ of sub-block SB1 of block BLK1 (sometimes referred to as select line $282_1$/SB1/BLK1) can be in electrical contact (e.g., can be electrically connected) to each other through connection $282'_1$. Thus, in memory device 200, select lines $282_1$/SB1/BLK0 and $282_1$/SB1/BLK1 can be provided (applied) with the same signal. This also means that select lines $282_1$/SB1/BLK0 and $282_1$/SB1/BLK1 can receive the same signal during an operation (e.g., read, write, or erase operation) of memory device 200.

FIG. 2 shows a connection $283'_1$ to indicate select line $283_1$ of sub-block SB0 of block BLK0 (sometimes referred to as select line $283_1$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_1$. Thus, in memory device 200, select lines $283_1$/SB0/BLK0 and $283_1$/SB0/BLK0 can be provided (applied) with the same signal. This also means that select lines $283_1$/SB0/BLK0 and $283_1$/SB0/BLK0 can receive the same signal during an operation (e.g., read, write, or erase operation) of memory device 200.

In the structure of memory device 200, each of connections $280'_0$, $281_0$, $282'_0$, $283'_0$, $280'_1$, $281_1$, $282'_1$, $283'_1$ can include a conductive material that is formed to be in electrical contact with the materials of two respective select lines. For example, connection $283'_0$ can include a conductive material that is formed to be in electrical contact with the material that form select lines $283_0$/SB0/BLK0 and the material that form select line $283_1$/SB0/BLK0. In another example, connection $282'_0$ can include a conductive material that is formed to be in electrical contact with the material that forms select lines $282_0$/SB0/BLK0 and the material that form select line $282_1$/SB0/BLK0.

The material (or materials) of each of connection $280'_0$, $281_0$, $282'_0$, $283'_0$, $280'_1$, $281_1$, $282'_1$, $283'_1$ can include metal, doped polysilicon, or other conductive materials. Each of the drain select circuits of memory device 200 can include multiple drain select gates connected in series (e.g., four transistors connected in series) between a respective data line and a respective memory cell string. The drain select gates can be controlled (e.g., turned on or turned off) by respective drain select lines based on voltages provided to the signals on the respective drain select lines. Each of the source select circuits of memory device 200 can include multiple source select gates connected in series between line 299 and a respective memory cell string. The source select gates can be controlled (e.g., turned on or turned off) by respective source select lines based on voltages provided to the signals on the respective source select lines.

In FIG. 2, each of the memory cell strings of memory device 200 has memory cells arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gates (e.g., transistors) in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can electrically connect (e.g., form a current path from) a selected memory cell string associated with that particular select circuit to a respective data line (e.g., one of data lines 270, 271, or 272). When a particular source select circuit is activated, it can electrically connect (e.g., form a current path from) a selected memory cell string associated with that particular select circuit to a source (e.g., line 299).

Figure 3:
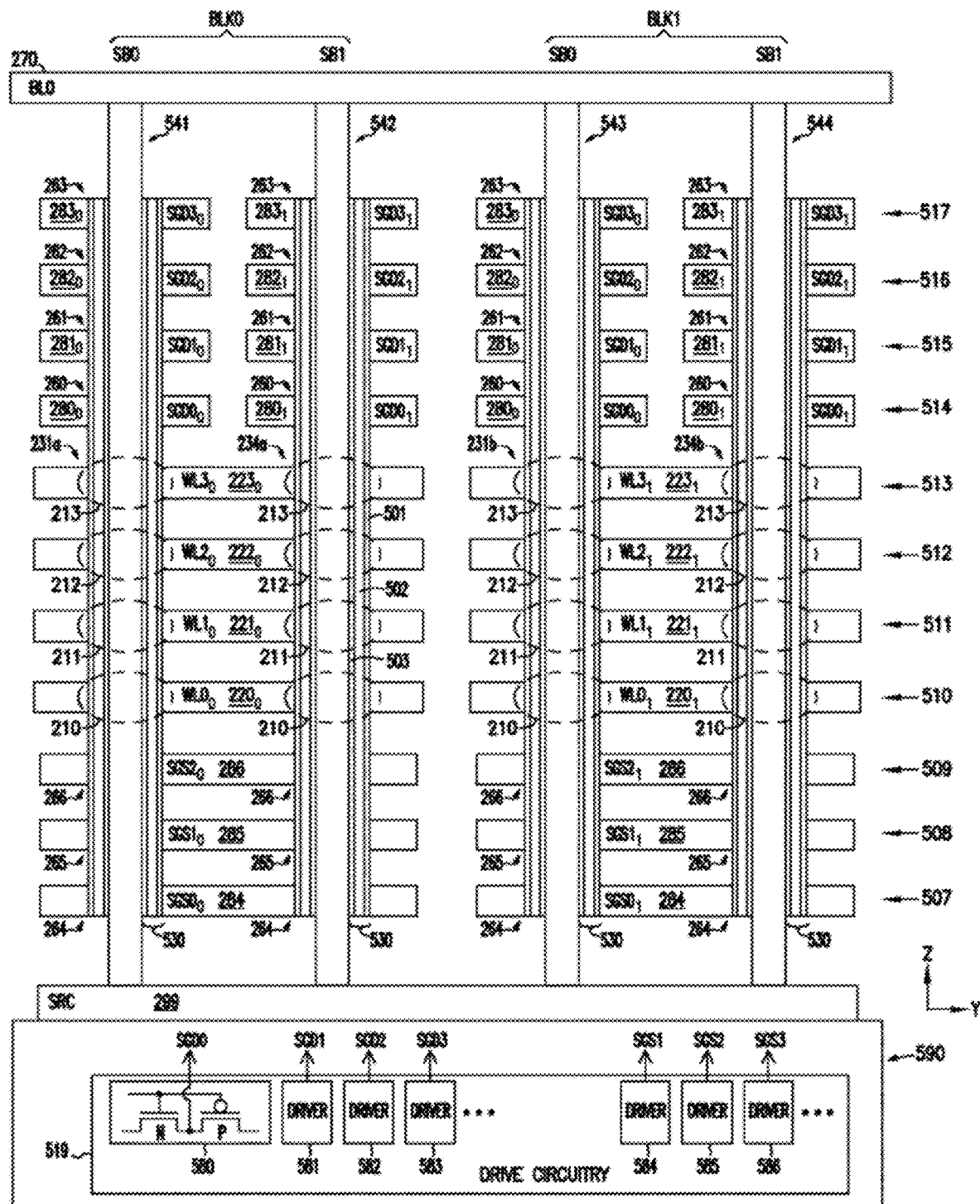
FIG. 3 is a side view of a structure of a portion of the memory device of FIG. 2, according to some embodiments.

FIG. 3 is a side view of a structure of a portion of the memory device 200 of FIG. 2, according to some embodiments. As shown in FIG. 3, memory device 200 can include a substrate 390 over which memory cells 210, 211, 212, and 213 of memory cell strings 231a, 234a, 231b, and 234b of respective sub-blocks SB0 and SB1 of blocks BLK0 and BLK1 can be formed (e.g., formed vertically in z-direction with respect to line 299 and substrate 390). Memory device 200 includes different levels 307 through 317 with respect to a z-direction. Levels 307 through 317 are internal device levels between substrate 390 and data line 270.

Substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type).

Memory device 200 can include drive circuitry 319 to provide signals (e.g., drain and source select line signals) to respective select lines of memory device 200. Drive circuitry 319 can correspond to or be included in the local media controller 135 of FIGS. 1A-1B. Although not shown in FIG. 3, substrate 390 can include circuitry that can be located directly under line 299. Such circuitry can include sense amplifiers, buffers (e.g., page buffers), decoders, and other circuit components of memory device 200. As shown in FIG. 3, drive circuitry 319 can include drivers (driver circuits) 380, 381, 382, and 383 to provide respective signals (e.g., drain select line signals SGD0, SGD1, SGD2, and SGD3), and drivers (driver circuits) 384, 385, and 386 to provide respective signals (e.g., source select line signals SGS0, SGS1, and SGS2). In FIG. 3, only some of the drain and source select signals are shown for simplicity.

In FIG. 3, each of drivers 380 through 386 can include two transistor N (e.g., NMOS) and P (e.g., p-channel MOS (PMOS)). For simplicity, detail of only one of drivers 380 through 384 is shown in FIG. 3. Each of drivers 380 through 386 can include an output node, e.g., a node located between and electrically connected to transistors N and P, to provide (e.g., drive) a respective signal (e.g., a drain select line signal or a source select line signal). The output node of each of drivers 380 through 386 can be coupled to (e.g., electrically connected to) a respective drain select line or a respective source select line of memory device 200. This allows the drain and source select line signals (e.g., SGD0, SGD1, SGD2, SGD3, SGS0, SGS1, and SGS2) from drive circuitry 319 to be provided to respective drain and source select lines of memory device 200 as described above with reference to FIG. 2 and FIG. 3.

FIG. 3 shows an example where each of drivers 380 through 386 can have two transistors of different transistor types (e.g., NMOS and PMOS) coupled in a complementary MOS (CMOS) connection. However, each of drivers 380 through 386 can have two transistors of the same types (e.g., two NMOS transistors or two PMOS transistors) and two separate transistor gate signals. Further, the number of transistors in each of drivers 380 through 386 may be different from two.

As shown in FIG. 3, data line 270 can have a length extending in the y-direction (e.g., shown in FIG. 3), which is perpendicular to the z-direction and the x-direction. Data line 270 can include a conductive material (e.g., conductively doped polycrystalline silicon (doped polysilicon), metals, or other conductive materials). Further, line 299 can include a conductive material and can have a length extending in the y-direction. FIG. 3 shows an example where line 299 (e.g., source) can be formed over a portion of substrate 390 (e.g., by depositing a conductive material over substrate 390). Alternatively, line 299 can be formed in or formed on a portion of substrate 390 (e.g., by doping a portion of substrate 390).

In at least some embodiments, select lines (e.g., drain select lines) $280_0$, $281_0$, $282_0$, and $283_0$ of each of blocks BLK0 and BLK1 can be located in respective levels 314, 315, 316, and 317. Select lines (e.g., drain select lines) $280_1$, $281_1$, $282_1$, and $283_1$ of each of blocks BLK0 and BLK1 can be located in respective levels 314, 315, 316, and 317.

In at least some embodiments, memory cells 210, 211, 212, and 213 of memory cell strings 231a, 234a, 231b, and 234b can be located in levels 310, 311, 312, and 313, respectively. Access lines $220_0$, $221_0$, $222_0$, and $223_0$ (associated with memory cells 210, 211, 212, and 213, respectively) of block BLK0 can be located in levels 310, 311, 312, and 313, respectively. Access lines $220_1$, $221_1$, $222_1$, and $223_1$ (associated with memory cells 210, 211, 212, and 213, respectively) of block BLK1 can be located in levels 310, 311, 312, and 313, respectively.

Select lines (e.g., source select lines) 284, 285, and 286 of each of blocks BLK0 and BLk1 can be located in different levels (e.g., levels 307, 308, and 309, respectively) between substrate 390 and memory cell strings 231a, 232a, and 233a. Memory device 200 can also include dielectric materials (not labeled in FIG. 3) interleaved with other elements in different levels of memory device 200. For example, memory device 200 can include dielectric materials (e.g., silicon dioxide) located between levels 314 and 317 and interleaved with (located in the spaces between) select lines $280_0$, $281_0$, $282_0$, and $283_0$ of each of blocks BLK0 and BLK1. In another example, memory device 200 can include a group of dielectric materials (e.g., silicon dioxide) located between levels 310 and 313 and interleaved with (located in the spaces between) access lines $220_0$, $221_0$, $222_0$, and $223_0$ of block BLK0. In another example, memory device 200 can include a group of dielectric materials (e.g., silicon dioxide) located between levels 310 and 313 and interleaved with (located in the spaces between) access lines $220_1$, $221_1$, $222_1$, and $223_1$ of block BLK1.

In another example, memory device 200 includes dielectric materials (e.g., silicon dioxide) located between levels 307 and 309 and interleaved with (located in the spaces between) select lines 284, 385, and 286. The materials of select lines $280_0$, $281_0$, $282_0$, $283_0$, $280_1$, $281_1$, $282_1$, $283_1$, 284, 285, and 286 can include conductively doped polycrystalline silicon, metals, or other conductive materials and can be the same as the conductive material of access lines $220_0$, $221_0$, $222_0$, $223_0$, $220_1$, $221_1$, $222_1$, and $223_1$. As shown in FIG. 3, memory device 200 can include pillars (conductive pillars) pillars 341, 342, 343, and 344 in respective sub-blocks SB0 and SB1 of blocks BLK0 and BLK1. Each of pillars 341, 342, 343, and 344 can have length extending outwardly (e.g., vertically in the direction of the z-direction and perpendicular to the y-direction). Each of pillars 341, 342, 343, and 344 can contact a conductive region of the material that forms part of data line 270 and contact a conductive region of the material that forms part of line 299.

Each of pillars 341, 342, 343, and 344 can include a material (or materials) to form a conductive path (e.g., a channel) between data line 270 and line 299. Such a material (e.g., undoped or doped polycrystalline silicon) of each of pillars 341, 342, 343, and 344 can be part of a channel (not shown in FIG. 3) of a respective pillar among pillars 341, 342, 343, and 344.

As shown in FIG. 3, memory device 200 can include a structure 330 adjacent a respective pillar of pillars 341, 342, 343, and 344 and extending continuously along a length of the respective pillar. Structure 330 is also adjacent portions of respective access lines ($220_0$, $221_0$, $222_0$, and $223_0$, or access lines $220_1$, $221_1$, $222_1$, and $223_1$). Structure 330 adjacent a respective pillar is located between the respective pillar and portions of respective access lines (access lines $220_0$, $221_0$, $222_0$, and $223_0$, or access lines $220_1$, $221_1$, $222_1$, and $223_1$). Structure 330 can include portions 301, 302, and 303. Parts of structure 330 along a particular pillar can form part of each of memory cells of the memory cell string adjacent that particular pillar. For example, structure 330 adjacent pillar 342 can form part of each of memory cells 210, 211, 212, and 213 of memory cell string 234a. Thus, each of memory cells 210, 211, 212, and 213 of a memory cell string can include part of structure 330 (part of each of portions 301, 302, and 303) located directly between one of the access lines (one of access lines $220_0$, $221_0$, $222_0$, and $223_0$, $220_1$, $221_1$, $222_1$, and $223_1$) and a respective pillar. For example, memory cell 212 of memory cell string 243a (adjacent pillar 342) can include part of each of portions 301, 302, and 303 located directly between access line $222_0$ and pillar 342.

Structure 330 can be part of a TANOS (TaN, $Al_2O_3$, $Si_3N_4$, $SiO_2$, Si) structure. For example, portion 301 (e.g., interpoly dielectrics) can include a charge blocking material or materials (e.g., a dielectric material such as TaN and $Al_2O_3$) that are capable of blocking a tunneling of a charge. Portion 302 can include a charge storage element (e.g., charge storage material or materials, such as $Si_3N_4$) that can provide a charge storage function (e.g., trap charge) to represent a value of information stored in memory cells 210, 211, 212, or 213. Portion 303 can include a dielectric, such as a tunnel dielectric material or materials (e.g., $SiO_2$) that are capable of allowing tunneling of a charge (e.g., electrons). As an example, portion 303 can allow tunneling of electrons from portion 304 to portion 302 during a write operation and tunneling of electrons from portion 302 to portion 304 during an erase operation of memory device 200. Moreover, portion 303 can allow tunneling of holes from portion 304 to portion 302, compensating the trapped electron recombination during an erase operation of memory device 200. In an alternative arrangement of memory device 200, structure 330 can be part of a SONOS (Si, $SiO_2$, $Si_3N_4$, $SiO_2$, Si) structure. In another alternative arrangement, structure 330 can be part of a floating gate structure (e.g., portion 302 can be polysilicon and each of portions 301 and 303 can be dielectric (e.g., $SiO_2$).

As shown in FIG. 3, a select line (e.g., $280_0$) is a piece (e.g., a single layer) of conductive material (e.g., polycrystalline silicon, metal, or other conductive materials). As described above, a select line can carry a signal (e.g., signal $SGD1_0$) but it does not operate like a switch (e.g., a transistor). A select gate (e.g., 260) can include a portion of a respective select line (e.g., a portion of the piece of the conductive material that forms the respective select line) and additional structures to perform a function (e.g., function of a transistor). For example, in FIG. 3, select gate 260 of sub-block SB0 of block BLK0 can include a portion of select line $280_0$ sub-block SB0 of block BLK0 and a portion of structure 330 (along pillar 341) adjacent select line $280_0$ of sub-block SB0 of block BLK0. In another example, select gate 261 of sub-block SB0 of block BLK0 can include a portion of select line $281_0$ sub-block SB0 of block BLK0 and a portion of structure 330 (along pillar 341) adjacent select line $281_0$ of sub-block SB0 of block BLK0.

FIG. 3 shows an example where select gates 261 through 266 have the same structure (e.g., TANOS structure) as memory cells 210, 211, 212, and 213. Alternatively, select gates 260, 261, 262, and 263 (e.g., drain select gate), select gates 264, 265, and 266 (e.g., source select gate), or select gates 260 through 266 can have a different structure, such as a FET structure. As is known to those skilled in the art, an FET usually includes a transistor gate, a transistor body channel, and a gate oxide between the transistor gate and the transistor body channel that can be in direct contact with the transistor gate and the transistor body channel.

Figure 4:
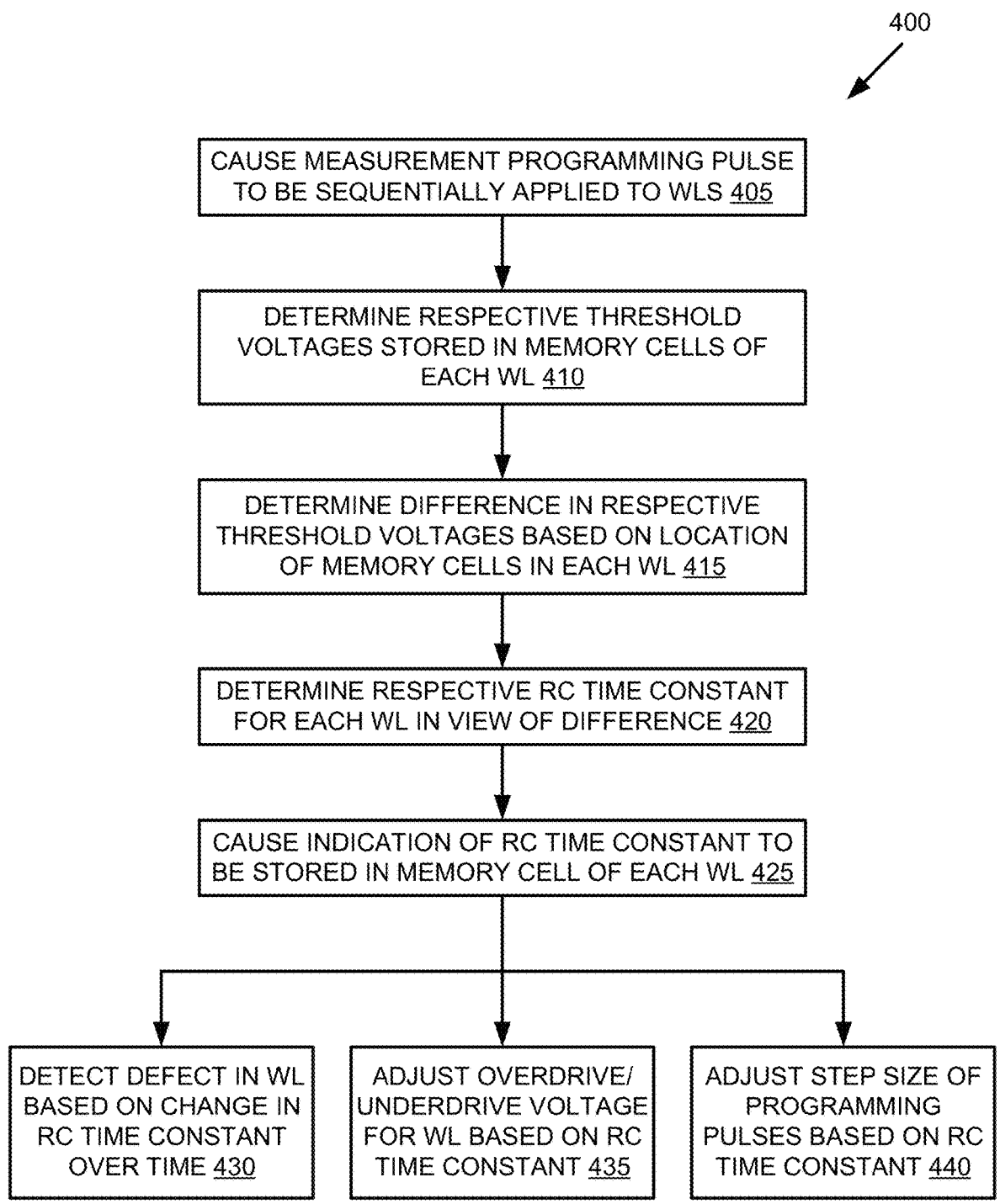
FIG. 4 is a flow diagram of an example method of tracking the RC time constant by wordline in memory devices of a memory sub-system in accordance with some embodiments of the present disclosure.

FIG. 4 is a flow diagram of an example method of tracking the RC time constant by wordline in memory devices of a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the RC time constant tracking component 137 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 5A:
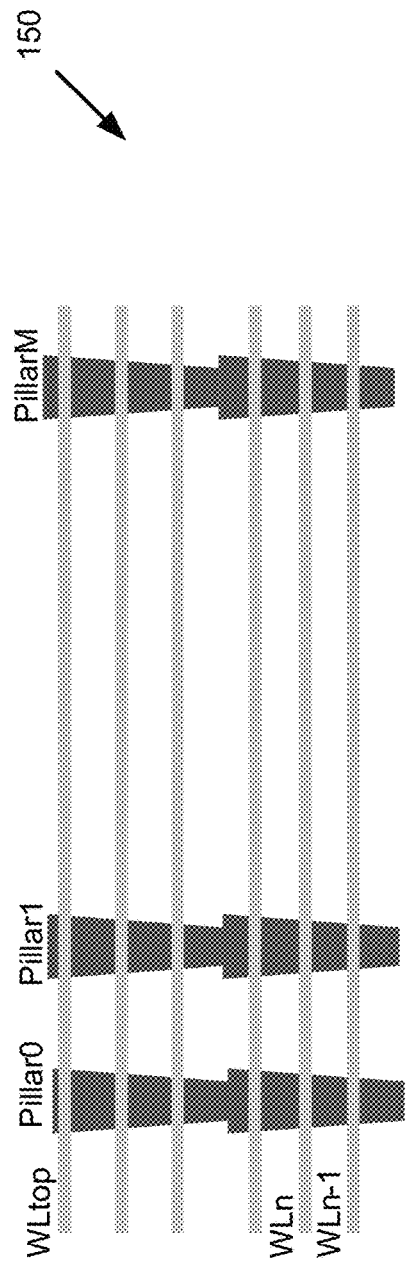
FIG. 5A is a diagram of an example memory array of a memory device in accordance with some embodiments of the present disclosure.
Figure 5B:
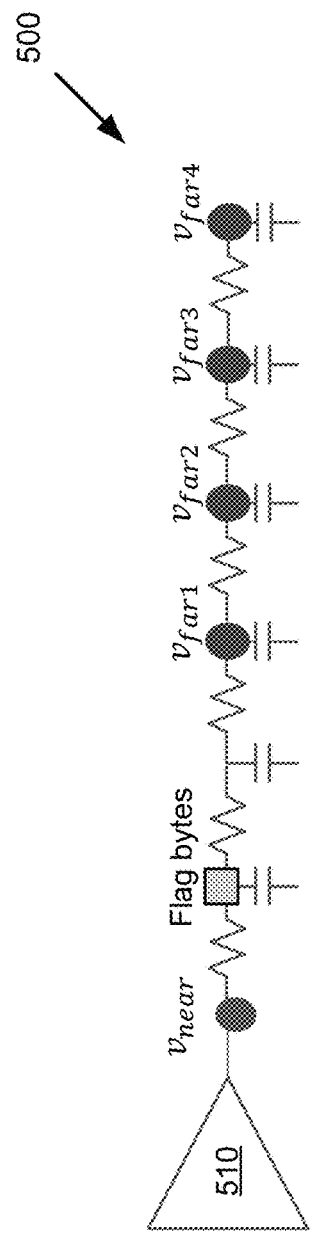
FIG. 5B is a diagram of an example wordline of a memory array in accordance with some embodiments of the present disclosure.

At operation 405, programming pulses are applied. For example, processing logic (e.g., RC time constant tracking component 137) can cause a measurement programming pulse to be sequentially applied to each of a plurality of wordlines of a memory array 150 of a memory device 130. In one embodiment, as illustrated in FIG. 5A, memory array 150 can include a number of wordlines (WLn−1, WLn . . . , WLtop), which can be one implementation of wordlines described above with respect to FIG. 2 and FIG. 3. Each of the wordlines in memory array 150 can intersect a number of vertical pillars (Pillar0, Pillar1 . . . , PillarM) to form the memory cells. The RC time constant of a given wordline can be impacted by the geometry of those intersections. For example, in memory array 150, the pillars can have a tapered shape, including one or more steps where the width of the pillars changes significantly. Thus, since the surface area of the intersection with the pillars varies with each wordline, the RC constant of each wordline can also vary. Wordlines that intersect a pillar where the pillar is thicker can have a higher resistivity and a higher RC time constant. In one embodiment, in response to a triggering event, RC time constant tracking component 137 can cause the measurement programming pulse to be sequentially applied to each wordline in memory array 150. For example, the RC time constant tracking component 137 can first cause the measurement programming pulse to be applied to WLn−1, then subsequently applied to WLn, and so on until WLtop. In one embodiment, the RC time constant tracking component 137 applies a control signal to a signal driver, such as driver 510 of FIG. 5B, to cause the signal driver coupled to a first end of a given wordline 500 (e.g., WLn) to apply the measurement programming pulse. In one embodiment, the measurement programming pulse is a relatively short voltage pulse (i.e., shorter than a typical programming pulse) having a magnitude determined via testing to target the average threshold voltage of a memory cell along wordline 500.

Referring again to FIG. 4, at operation 410, threshold voltages are determined. For example, the processing logic can determine respective threshold voltages stored in a number of memory cells associated with each of the plurality of wordlines. At operation 415, a difference is determined. For example, the processing logic can determine a difference in the respective threshold voltages based on a location of the number of memory cells within each wordline. In one embodiment, the RC time constant tracking component 137 can read the voltage programmed to the number of memory cells. Depending on the embodiment, the number of memory cells can include all of the memory cells associated with the wordline, such as wordline 500, or a subset of the memory cells associated with the wordline. Due to resistance along the length of the wordline, the threshold voltage can decrease as the memory cells get further away from end of the wordline at which the measurement programming pulse was applied (i.e., where signal driver 510 is connected). For example, the threshold voltage vnear may be higher than the threshold voltages vfar1, vfar2, vfar3, vfar4 illustrated in FIG. 5B.

In one embodiment, the RC time constant tracking component 137 can perform a program verify operation on each wordline of memory array 150, such that a program verify voltage is applied to each wordline. As part of the program verify operation, the RC time constant tracking component 137 can identify a first set of memory cells within a threshold distance of the first end of each wordline (i.e., the "near" memory cells) and a second set of memory cells beyond the threshold distance from the first end of each wordline (i.e., the "far" memory cells). RC time constant tracking component 137 can determining a first number of memory cells within the first set having threshold voltages below a program verify level (e.g., associated with the program verify voltage) and a second number of memory cells within the second set having threshold voltages below the program verify level. RC time constant tracking component 137 can further determine a difference between the first number of memory cells and the second number of memory cells, where this difference represents an amount of change in the threshold voltage of the memory cells along the wordline 500.

Referring again to FIG. 4, at operation 420, RC time constants are determined. For example, the control logic can determine a respective RC time constant for each of the plurality of wordlines in view of the difference in the respective threshold voltages. In one embodiment, the RC time constant tracking component 137 utilizes a lookup table 139, or other data structure to determine respective RC time constants for each of the wordlines. Lookup table 139 can include a number of entries each relating a certain slope of cell threshold voltage (i.e., the difference in the respective threshold voltages based on location) to a corresponding RC time constant. For example, the RC time constant tracking component 137 can identify an entry in lookup table 139 including an indication of the determined slope and determine the corresponding RC time constant from that entry. The entries in lookup table 139 can be populated before operation of memory device 130, where the values in the entries are determined via a testing process performed during device manufacture.

At operation 425, data is stored. For example, the control logic can cause an indication of the respective RC time constant to be stored in at least one of the memory cells associated with each respective wordline. In one embodiment, RC time constant tracking component 137 can cause the indication, such as the "flag bytes" shown in FIG. 5B, to be written to at least one memory cell of the wordline 500. With the indication of the RC time constant for wordline 500 being stored in the memory cells of wordline 500, the RC time constant is easily accessible for future use, such as to optimize operation of the memory array 150.

As discussed above, the operations 405-425 can be performed sequentially for each wordline of the memory array 150, or for any subset of one or more wordlines of the memory array 150. For example, each of operations 405-425 can be performed once for a first wordline (e.g., WLn−1). Subsequently, each of operations 405-425 can be performed once for a second wordline (e.g., WLn), and so on. In one embodiment, a certain operation or operations can be performed for multiple wordlines before a subsequent operation or operations are performed for those wordlines. For example, operations 405-410 can be performed for multiple wordlines before operations 415-425 are performed for any wordlines.

Once operations 405-425 have been performed for one or more wordlines of memory array 150, additional operations 430-440 can be performed that utilize the RC time constant to improve operation of the memory device 130. In one embodiment, these additional operations are performed by the RC time constant tracking component 137. In other embodiments, however, these additional operations can be performed by other components, such as by memory subsystem controller 115 of FIG. 1. Additional operations 430-440 are independent and can be performed separately from one another. In addition, multiple ones of operations 430-440 can be performed on memory device 130 either sequentially or in parallel.

At operation 430, a defect is detected. For example, the control logic can detect a defect in at least one of the plurality of wordlines based on a change in the respective RC time constant for the at least one wordline over time. In one embodiment, the control logic can determine the RC time constant for a given wordline 500 according to the steps described above for operations 405-420. Upon determining the RC time constant, the control logic can compare the determined RC time constant to the indication of the RC time constant (e.g., from the "flag bytes") stored after a previous determination. If there is a change in the RC time constant (e.g., if the more recently determined RC time constant is lower than the stored RC time constant by more than a threshold amount), the control logic can detect deterioration of the wordline or the presence of some other defect. The deterioration could be caused by an excessive number of program/erase cycles, for example, or the defect could be an electrical short, a delamination, or other defect. Depending on the embodiment, the control logic can optionally update the stored indication of the RC time constant with the more recently determined RC constant.

At operation 435, voltages are adjusted. For example, the control logic can adjust at least one of an overdrive voltage or an underdrive voltage for one of the plurality of wordlines based on the respective RC time constant. During a memory access operation (e.g., a programming operation) performed on memory device 130, the control logic can cause certain voltage signals to be applied to the wordlines of the memory array 150. The control logic can cause a voltage signal to be applied in one or more pulses, known as program pulses, to a wordline associated with memory cells. The magnitude of the voltage and the width of each pulse can determine the amount of charge that will be stored at the memory cells associated with the wordline, and in turn programs the state of the memory cells. A series of pulses can be applied to a wordline in order to gradually raise the memory cell to target threshold voltage (Vt) while not over-programming the memory cell. In certain solutions to evolving specifications and requirements, pump regulator circuitry of a local media controller can be adapted to provide a measure of overdrive voltage or underdrive voltage, when necessary, to the voltage applied to the wordlines. The overdrive voltage can include a higher voltage than would normally be applied, such that the memory cells of the wordline can reach the target threshold voltage in a shorter amount of time. The underdrive voltage can include a lower voltage than would normally be applied, such that the memory cells of the wordline can reach the target threshold voltage in a shorter amount of time. In one embodiment, the particular amount of overdrive voltage or underdrive voltage can be determined based on the determined RC time constant for a given wordline. For example, the control logic can utilize a lookup table comprising a number of entries, each having an associated RC time constant and a set of one or more trim settings (e.g., corresponding overdrive voltage and/or underdrive voltage). Accordingly, the control logic can identify the entry corresponding to the determined RC time constant, determine the associated overdrive voltage or underdrive voltage, and cause the determined overdrive voltage or underdrive voltage to be applied to the wordline during the memory access operation.

At operation 440, a programming step size is adjusted. For example, the control logic can adjust a step size between programming pulses for a programming operation performed on one of the plurality of wordlines based on the respective RC time constant. In one embodiment, data is programmed to the memory cells of memory array 150 using a sequence of programming pulses having a particular programming step size (i.e., the amount that the magnitude of the program voltage is increased between each of the successive programming pulses). The control logic can be preconfigured to use a default programming step size (e.g., an initial voltage value), but such programming step size is a configurable parameter. In one embodiment, the control logic can adjust the step size (e.g., increase or decrease the amount by which a subsequent programming pulse exceeds a previous programming pulse) based on the RC time constant of a given wordline. For example, the control logic can utilize a lookup table comprising a number of entries, each having an associated RC time constant and a set of one or more trim settings (e.g., corresponding programming step size). Accordingly, the control logic can identify the entry corresponding to the determined RC time constant, determine the associated programming step size, and cause the determined programming step size to be utilized for a series of programming pulses applied to the wordline during the memory access operation.

Figure 6:
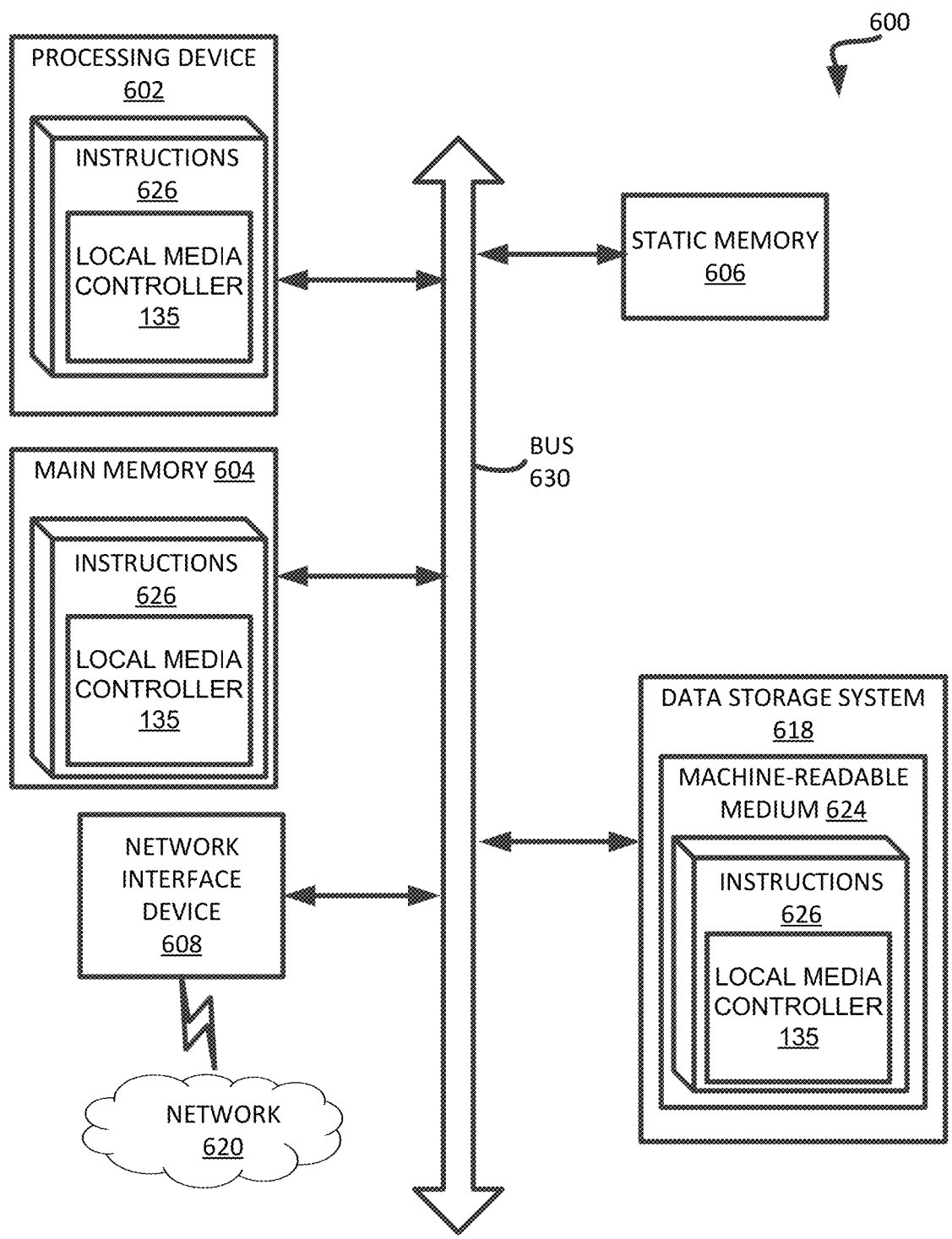
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the RC time constant tracking component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to the RC time constant tracking component 137 of FIG. 1A). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array comprising a plurality of wordlines; and
    control logic, operatively coupled with the memory array, to perform operations comprising:
        causing a measurement programming pulse to be sequentially applied to each of the plurality of wordlines of the memory array;
        determining respective threshold voltages stored in a number of memory cells associated with each of the plurality of wordlines;
        determining a difference in the respective threshold voltages based on a location of the number of memory cells within each wordline; and
        determining a respective resistance-capacitance (RC) time constant for each of the plurality of wordlines in view of the difference in the respective threshold voltages.

2. The memory device of claim 1, wherein the control logic is to perform operations further comprising:
    causing an indication of the respective RC time constant to be stored in at least one of the memory cells associated with each respective wordline.

3. The memory device of claim 1, wherein causing the measurement programming pulse to be sequentially applied to each of the plurality of wordlines of the memory array comprises causing a signal driver coupled to a first end of each of the plurality of wordlines to apply the measurement programming pulse.

4. The memory device of claim 3, wherein determining the difference in the respective threshold voltages based on the location of the number of memory cells within each wordline comprises determining how much the respective threshold voltages decrease as the distance of the memory cells from the first end of each wordline increases.

5. The memory device of claim 3, wherein determining the difference in the respective threshold voltages based on the location of the number of memory cells within each wordline comprises:
    identifying a first set of memory cells within a threshold distance of the first end of each wordline and a second set of memory cells beyond the threshold distance from the first end of each wordline;
    determining a first number of memory cells within the first set having threshold voltages below a program verify level and a second number of memory cells within the second set having threshold voltages below the program verify level; and
    determining a difference between the first number of memory cells and the second number of memory cells.

6. The memory device of claim 1, wherein determining the respective RC time constant for each of the plurality of wordlines comprises identifying corresponding entries in a data structure, each entry comprising an indication of the difference in the respective threshold voltages and an indication of the respective RC time constant.

7. The memory device of claim 1, wherein the control logic is to perform operations further comprising:
    detecting a defect in at least one of the plurality of wordlines based on a change in the respective RC time constant for the at least one wordline over time.

8. The memory device of claim 1, wherein the control logic is to perform operations further comprising:
    adjusting at least one of an overdrive voltage or an underdrive voltage for one of the plurality of wordlines based on the respective RC time constant.

9. The memory device of claim 1, wherein the control logic is to perform operations further comprising:
    adjusting a step size between programming pulses for a programming operation performed on one of the plurality of wordlines based on the respective RC time constant.

10. A method comprising:
    causing a measurement programming pulse to be sequentially applied to each of the plurality of wordlines of a memory array of a memory device;
    determining respective threshold voltages stored in a number of memory cells associated with each of the plurality of wordlines;
    determining a difference in the respective threshold voltages based on a location of the number of memory cells within each wordline; and
    determining a respective resistance-capacitance (RC) time constant for each of the plurality of wordlines in view of the difference in the respective threshold voltages.

11. The method of claim 10, further comprising:
    causing an indication of the respective RC time constant to be stored in at least one of the memory cells associated with each respective wordline.

12. The method of claim 10, wherein causing the measurement programming pulse to be sequentially applied to each of the plurality of wordlines of the memory array comprises causing a signal driver coupled to a first end of each of the plurality of wordlines to apply the measurement programming pulse.

13. The method of claim 12, wherein determining the difference in the respective threshold voltages based on the location of the number of memory cells within each wordline comprises determining how much the respective threshold voltages decrease as the distance of the memory cells from the first end of each wordline increases.

14. The method of claim 12, wherein determining the difference in the respective threshold voltages based on the location of the number of memory cells within each wordline comprises:
   identifying a first set of memory cells within a threshold distance of the first end of each wordline and a second set of memory cells beyond the threshold distance from the first end of each wordline;
   determining a first number of memory cells within the first set having threshold voltages below a program verify level and a second number of memory cells within the second set having threshold voltages below the program verify level; and
   determining a difference between the first number of memory cells and the second number of memory cells.

15. The method of claim 10, wherein determining the respective RC time constant for each of the plurality of wordlines comprises identifying corresponding entries in a data structure, each entry comprising an indication of the difference in the respective threshold voltages and an indication of the respective RC time constant.

16. The method of claim 10, further comprising:
   detecting a defect in at least one of the plurality of wordlines based on a change in the respective RC time constant for the at least one wordline over time.

17. The method of claim 10, further comprising:
   adjusting at least one of an overdrive voltage or an underdrive voltage for one of the plurality of wordlines based on the respective RC time constant.

18. The method of claim 10, further comprising:
   adjusting a step size between programming pulses for a programming operation performed on one of the plurality of wordlines based on the respective RC time constant.

19. A memory device comprising:
   a memory array comprising a plurality of wordlines; and
   control logic, operatively coupled with the memory array, to perform operations comprising:
      causing a measurement programming pulse to be applied to a wordline of the plurality of wordlines of the memory array;
      determining respective threshold voltages stored in a number of memory cells associated with the wordline;
      determining a difference in the respective threshold voltages based on a location of the number of memory cells within the wordline; and
      determining a resistance-capacitance (RC) time constant for the wordline in view of the difference in the respective threshold voltages.

20. The memory device of claim 19, wherein the control logic is to perform operations further comprising:
   causing an indication of the RC time constant to be stored in at least one of the memory cells associated with the wordline.

* * * * *